(12) United States Patent
Neuhaus

(10) Patent No.: US 6,254,107 B1
(45) Date of Patent: Jul. 3, 2001

(54) ELECTRICALLY CONDUCTIVE SEAL AND A PROCESS FOR THE MANUFACTURE THEREOF

(75) Inventor: Alexander Neuhaus, Berlin (DE)

(73) Assignee: Neuhaus Elektronik GmbH, Berlin (DE)

( * ) Notice: Subject to any disclaimer, the term of this patent is extended or adjusted under 35 U.S.C. 154(b) by 0 days.

(21) Appl. No.: 09/118,686

(22) Filed: Jul. 17, 1998

(30) Foreign Application Priority Data

Jul. 29, 1997 (DE) ................................ 197 33 627

(51) Int. Cl.[7] .............. H05K 5/00; F16J 15/08; F16J 15/10

(52) U.S. Cl. .............. 277/650; 277/652; 277/654; 174/17 CT

(58) Field of Search .................. 277/920, 922, 277/924, 939, 940, 938, 942, 652, 654, 650; 174/17 CT

(56) References Cited

U.S. PATENT DOCUMENTS

| 3,783,173 | * | 1/1974 | Twomey ................................ 277/920 |
| 4,371,175 | * | 2/1983 | Van Dyk, Jr. ........................... 277/34 |
| 4,399,317 | * | 8/1983 | Van Dyk, Jr. ........................... 174/35 |
| 5,068,493 | * | 11/1991 | Benn, Sr. et al. ...................... 174/35 |
| 5,141,770 | * | 8/1992 | Benn, Sr. et al. ...................... 174/35 |
| 5,416,269 | * | 5/1995 | Kemp et al. ........................... 174/36 |
| 5,524,908 | * | 6/1996 | Reis ..................................... 277/227 |
| 5,804,762 | * | 9/1998 | Jones et al. ........................... 277/920 |

* cited by examiner

*Primary Examiner*—Anthony Knight
*Assistant Examiner*—Vishal Patel
(74) *Attorney, Agent, or Firm*—Wood, Phillips, VanSanten, Clark & Mortimer

(57) ABSTRACT

An electrically conductive seal which is metered onto a sealing surface in a freshly-extruded condition, for the junction point between two housing sections of a conductive housing which accommodates electronic modules, for shielding from interference radiation and for the prevention of a material transfer through the sealing gap is constructed in two or more layers by means of co-extrusion and encompasses at least one internally-positioned elastic sealant strand which does not contain conductive components, as well as an external ring-shaped conductive strand which encases the latter and which has low inherent elasticity and wall thickness and is made of an elastic sealant which is mixed with electrically conductive constituents. As a supplement or an option, an absorber strand which is made of magnetic constituents which are imbedded in a sealing material may be provided in the inside of the seal.

33 Claims, 1 Drawing Sheet

ELECTRICALLY CONDUCTIVE SEAL AND A PROCESS FOR THE MANUFACTURE THEREOF

Figure 1:
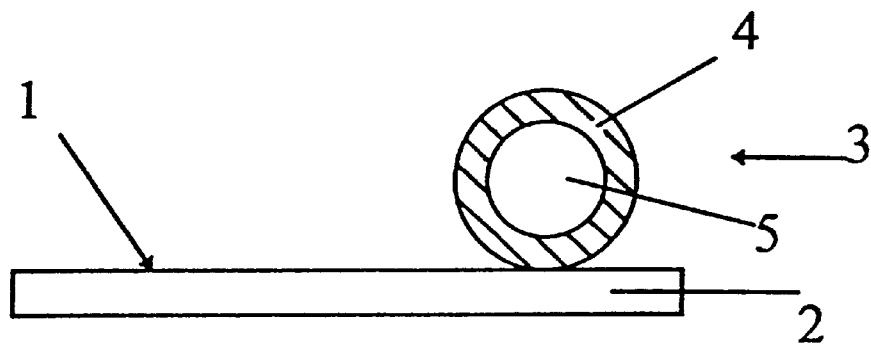

The invention concerns an electrically conductive seal, consisting of a freshly-extruded sealant that is still in a plastic condition and which is mixed with electrically conductive components, is applied onto a sealing surface for the sealing gap of a conductive housing which accommodates electronic modules for the purpose of electromagnetic shielding and for the prevention of a material transfer through the sealing gap, as well as a process for the manufacture of a seal of this type.

It is known that electronic modules create electromagnetic interference signals which escape to the outside through the gaps of the housing in which the electronic modules are located and are transmitted to other electronic modules by means of signal conductors, specifically once again through the gaps of the housings which accommodate them, and which may lead to damage and malfunctions of the other electronic modules.

In order to prevent electromagnetic waves which have the effect of interference signals from escaping from one housing and penetrating into another housing, which may thus impair the function of the influenced electronic module, the surfaces which form the gap of the housing are sealed from one another by means of an electrically conductive seal. The housing, which is also constructed to be conductive, works together with the conductive seal as a Faraday cage, in order to thus prevent the radiation of electromagnetic waves or to shield against interfering radiation effects.

Together with the shielding from electromagnetic interference radiation because of the conductivity of the utilized material, another significant function of this type of seal exists in the protection of the electronic device from the effects of contaminant particles, moisture and toxic gases. The electronic seal must therefore satisfy at the same time the demands usually placed on a seal used in structural technology and in machine construction for the prevention of material transfer between two spaces.

In an electromagnetic sealing medium which is described in DE 39 34 845 A1 in the criticized state of the art, conductive metallic solid particles are incorporated into a material with rubber-like elasticity in order to effect an electromagnetic sealing between the two housing sections simultaneously with the mechanical seal. Silver is utilized as an excellent conductive component which, however, is expensive on the one hand and, on the other, leads to a reduction in elasticity which negatively influences the sealing properties in the quantity needed to achieve the required conductivity and also to a significant increase in the specific weight of the seal. As a solution to the aforementioned problems, DE 39 34 845 A1 recommends a conductive seal which is formed from a non-conductive elastic seal element and a conductive layer which is applied to the non-conductive layer on the concerned sealing surface, and whose edge areas are in direct contact with the housing surface. The conductive layer consists of an elastic material mixed with a conductive supplement.

In this manner, a conductive seal with a low proportion of metal and high elasticity is made available. However, the costly production process in which a paste in the form of a strand is first applied to the sealing surface of a housing and the paste is then hardened to a rubbery-elastic sealing profile, on which and on the adjacent areas of the seal gap surface the conductive layer is sprayed in an additional process step in the form of a liquefied mass, is disadvantageous. Together with the costly formation of the sealant strand, this process is also disadvantageous for the reason that increased space is required for the conductive layer which is sprayed on.

In DE 43 19 965 C2 which is more recent in priority compared to the afore-mentioned state of the art, a paste-like initial material is also applied to the housing surface to be sealed, which also hardens elastically to a sealing element of a specific form. However, according to this solution, the elastic initial material is mixed in a known manner with the conductive particles. The disadvantages previously stated in the criticism of the state of the art in recommendation based on DE 39 34 845 A1, which consist of the high costs for the large proportion of silver, the high weight, the decrease in elasticity with the growing metallic proportion and the worsened sealing effect because of the unsatisfactory contact with the sealing gap surface are the result of this.

For an improvement in the elasticity properties of the shielding profile formed from the conductive materials mixed with the elastic material, the solution revealed in DE 43 19 965 C2 recommends a seal which is formed from several individual strands in order to create profile cross-sections in a form which effects a certain elasticity. From the processing and equipment aspect, the application of multiple sealant strands is costly and has the additional requirement for more space, wider housing surfaces and higher material costs as a result.

In the sealing of the gap which remains between the two sections of the housing, the compensation for dimensional deviations between the housing and the cover often presents problems, so that cost-intensive seals with a larger diameter and, in addition to this, significant clamping forces which lead to distortion of the housing are required with larger tolerances.

The object which forms the basis of the invention is therefore to develop an electrically conductive seal for the prevention of a material transfer and for the electromagnetic shielding of electronic modules which are accommodated in a conductive housing, which have high elasticity and sealing effect with low space requirements and costs, and which can be produced with low costs.

In accordance with the invention, this object is achieved by an electrically conductive seal according to the preamble of patent claim 1 in such a manner that it is made by means of co-extrusion double- or multilayered and is constructed from at least one internally-positioned elastic sealant strand which is free of conductive components and from one ring-shaped external conductive strand which encompasses the latter with low inherent elasticity and is made of a sealant which is mixed with electrically conductive components.

In other words, the basic idea of the invention lies in the construction of a conductive seal which is made of a non-conductive, large-volume and thus highly-elastic core and a comparably thin-walled and flexible conductive sheathing which consists of an elastic sealing material that is mixed with conductive particles, whereby the two differing materials are simultaneously extruded and applied to the sealing surface in a condition which is still plastic and not yet hardened.

As a result, a seal is made available which, because of the large-volume core which is free of conductive components, is highly elastic in its entirety and therefore makes possible a reliable seal of the junction point between the housing cover and lower section with low clamping forces, specifically without distorting the housing, even with larger tolerances. The high elasticity of the seal in accordance with the invention ensures adequately-high restoring forces even after lengthy stressing and thus reliable radiation shielding and sealing protection against material transfer, even after multiple opening and closing procedures. Because of the fact that the conductive strand is constructed as the sheath which encompasses the sealant strand on all sides, a reliable electrical connection between the sealing surfaces may be produced with low space requirements because of the high elasticity, so that the effect of the housing as a Faraday cage is not interrupted. In addition, the comparatively-low proportion of electrically conductive particles, which are nevertheless tightly packed in the sheathing and which guarantee high conductivity, has a weight and cost reducing effect.

An essential benefit is the simple manufacturing of the proposed conductive seal, which is accomplished by co-extrusion of the sealant and the conductive strand of a pasty initial material which is provided separately from the respective movable extrusion head which is guided by an x-y-z robot, or onto a movable sealing surface in a single work operation. In this, the total thickness of the seal, independently of the dimensioning of the co-extrusion head or the exit nozzle, can already be adjusted by the processing speed of the x-y-z robot with which the strand is applied to the sealing surface of the housing sections in its initially-pasty condition. By a change of the extrusion pressure and an adjustment of the co-extrusion head, the thickness of the sealant strand and of the conductive strand may be determined on the basis the housing version. For this, the internally-positioned sealant strand for the sealing of metallized thin-walled plastic housings which must be closed with low cover clamping forces without distortion, or when greater tolerances between the two housing sections must be compensated, is constructed with a comparatively large diameter, while with stabile diecast housings which may also be united with one another with greater clamping forces, for example, sealant strands with a small diameter are adequate.

In accordance with another significant feature of the invention, the conductive seal can also be made multilayered by providing an additional absorber strand which is formed from a sealant and magnetic components which are implanted therein between the sealant strand and the externally-positioned conductive strand. As a result of this, the shielding effect of the conductive strand which is based on reflection may be supported by the absorption of interference radiation.

Finally, it is also possible to arrange multiple layers made of sealants which do not contain conductive media and those which are filled with conductive components alternately, as well as with one or more absorption layers.

In an advantageous embodiment of the invention, an elastomer is utilized as the sealant, preferably a silicon elastomer which, at room temperature and a specific humidity, or as required with applied heat, hardens with form stability in the form of the co-extruded strand as an elastic seal which adheres to the sealing surface.

As conductive media, carbon-black or metal particles are utilized, while filler materials of silver or silvered metal or glass particles are preferable. Provided that an absorber strand is integrated into the seal, it is composed of the concerned sealant and magnetic components such as iron or nickel as a filler material.

In the subordinate claims and the execution example, additional suitable embodiments or benefits of the invention are indicated.

Figure 2:
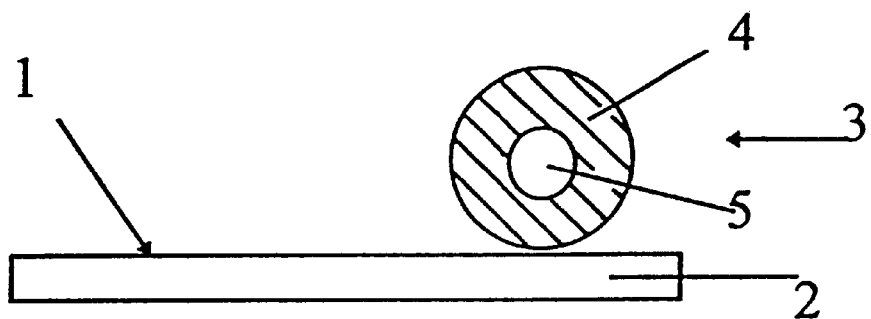
Figure 3:
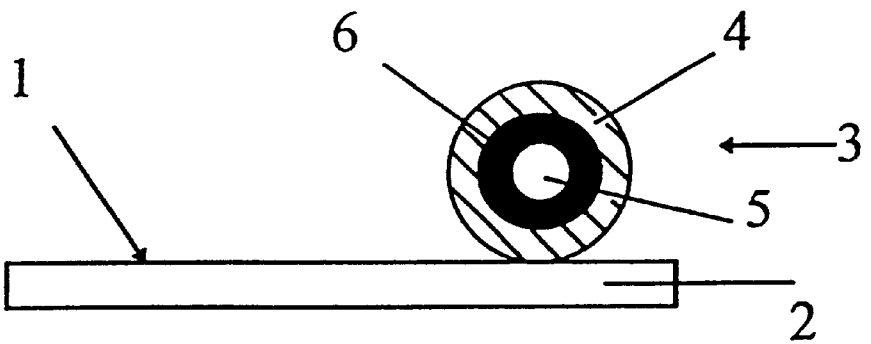

An execution example of the invention is described in detail based on the drawing. Depicted are:

FIG. 1 a vertical section through an electrically conductive two-layer seal which has been applied on the sealing surface of an electrically conductive housing;

FIG. 2 a sectional view in accordance with FIG. 1, however with a different layer thickness; and FIG. 3 a sectional view of a multi-layer seal with an integrated absorber layer.

In FIGS. 1 to 3, reference character 1 designates a lower sealing surface of a sealing gap which is formed between a housing lower section 2 and a housing cover (not represented). The electrically conductive seal 3 consists of an externally-positioned ring-shaped conductive strand 4 and an internally-positioned sealant strand 5. In accordance with FIG. 1, the ring-shaped conductive strand 4 has a wall thickness which is thin in comparison to sealant strand 5, while its wall thickness in FIG. 2 is significantly greater and the diameter of the internally-positioned sealant strand 5 is correspondingly smaller. FIG. 3 depicts a further embodiment variation with a three-layer construction, that is, with an absorber strand 6 which is positioned between the conductive strand 4 and the elastic sealant strand 5.

The sealant ring 5 consists of a silicon elastomer, while the conductive strand 4 is formed of silicon elastomer mixed with silver components and finally the absorber layer 6 is formed from silicon elastomer and iron particles which are imbedded therein. Because of its comparatively high proportion of silver in a thin silicon elastomer layer, the ring-shaped conductive strand 4 is highly conductive, so that interference radiation which impinges upon the conductive seal is reflected or is conducted further into the conductive housing. Despite its low inherent elasticity, this layer is nevertheless flexible and expandable. On the other hand, the high elasticity of the electrically conductive seal 3 is effectuated by means of the sealant strand 5, which does not contain conductive layers and which also occupies a high volume, so that even when there are dimensional deviations of the sealing gap, a high sealing effect for the avoidance of material transfer and simultaneously a conductive connection between the housing sections is ensured, since the conductive strand 4 adheres firmly to the sealing surfaces 1 of the housing 2. The passage of interference radiation through the sealing gap is additionally prevented by means of the absorber strand 6, in which radiation which is not reflected is absorbed by the conductive strand.

Of course, the seal 3 may also be constructed of multiple layers arranged alternately, or it may also consist of only one externally-positioned ring-shaped conductive strand and one internally-positioned absorber strand.

The application of the conductive seal 3 is performed from an extruder which may be moved above the sealing surface 1 of the housing section 2, from which the sealant strand 5 and the conductive strand 4 are simultaneously extruded by means of co-extrusion while still in a plastic state, and the freshly-extruded strand is distributed on the sealing surface 1 during the travel motion. The silicon elastomer of the conductive layer 4, which is still plastic when it is extruded, adheres to the sealing surface 1, whereby the silicon elastomer finally hardens at room temperature or with the introduction of heat, with the formation of a sealing strand which is stabile in form and creates a fixed and permanent junction with the sealing surface 1.

What is claimed is:

1. In combination;
   a conductive housing having an associated cover and an electrically conductive seal which is directly applied onto a sealing surface of said housing or said cover while freshly-extruded and in a condition which is still plastic and not yet hardened for sealing a gap of the conductive housing which accommodates electromagnetic modules for electromagnetic shielding and for prevention of material transfer past the sealing gap, wherein the electrically conductive seal is made by means of co-extrusion constructed from at least one internally-positioned elastic sealant strand which is free of conductive components and is still plastic and not yet hardened, and at least one ring-shaped external electrically conductive strand, which is still plastic and not yet hardened, and which encompasses the at least one internally-positioned elastic sealant strand, has low inherent elasticity and wall thickness, and is made of a non-conductive material mixed with electrically conductive components.

2. The combination of a conductive housing having an associated cover and an electrically conductive seal in accordance with claim 1, further comprising at least one additional ring-shaped strand.

3. The combination of a conductive housing having an associated cover and an electrically conductive seal in accordance with claim 1, wherein the electrically conductive seal further comprises an absorber strand, the thickness of the elastic sealant strand and conductive strand as well as that of the absorber strand may be changed.

4. The combination of a conductive housing having an associated cover and an electrically conductive seal in accordance with claim 1, wherein the electrically conductive seal comprises an elastomer which hardness to a rubbery-elastic molded body at room temperature and humidity or with the introduction of heat.

5. The combination of a conductive housing having an associated cover and an electrically conductive seal in accordance with claim 4, wherein the elastomer is a silicon elastomer.

6. The combination of a conductive housing having an associated cover and an electrically conductive seal in accordance with claim 1, wherein the conductive components of the conductive strand consist of carbon-black or metal particles.

7. The combination of a conductive housing having an associated cover and an electrically conductive seal in accordance with claim 6, wherein the metal particles comprise at least one of silver and silver-sheathed metal and silver-sheathed glass particles.

8. The combination of a conductive housing having an associated cover and an electrically conductive seal in accordance with claim 1, wherein the electrically conductive seal is manufactured such that the co-extrusion of the elastic sealant strand, electrically conductive strand and, an absorber strand, is directly applied onto the sealing surface of said conductive housing or said cover while still in a pasty condition.

9. The combination of a conductive housing having an associated cover and an electrically conductive seal, in accordance with claim 8, wherein the electrically conductive seal is manufactured such that the co-extrusion and the application takes place during a relative motion between a co-extrusion tool and, whereby the seal is continuously applied onto the sealing surface and finally hardens with form stability.

10. The combination of a conductive housing having an associated cover and an electrically conductive seal in accordance with claim 9, wherein the electrically conductive seal is manufactured such that the co-extrusion tool is moved above the sealing surface of a stationary housing section.

11. The combination of a conductive housing having an associated cover and an electrically conductive seal in accordance with claim 9, wherein the electrically conductive seal is manufactured wherein the housing with the sealing surface is moved below the co-extrusion tool.

12. The combination of a conductive housing having an associated cover and an electrically conductive seal in accordance with claim 8, wherein the electrically conductive seal is manufactured wherein the movement speed of a co-extrusion tool or of the housing may be changed in order to influence the thickness of the seal.

13. The combination of a conductive housing having an associated cover and an electrically conductive seal in accordance with claim 8, wherein the electrically conductive seal is manufactured wherein the respective extrusion pressure for the formation of the sealant strand, of the conductive strand and of the absorber strand is variably adjustable in the respectively-desired variable thickness.

14. The combination of a conductive housing having an associated cover and an electrically conductive seal in accordance with claim 2, further comprising an absorber strand, wherein the thickness of the elastic sealant strand, electrically conductive strand and the absorber strand may be changed.

15. The combination of a conductive housing having an associated cover and an electrically conductive seal in accordance with claim 9, wherein the electrically conductive seal is manufactured wherein the movement speed of the co-extrusion tool or of the housing may be changed in order to influence the thickness of the seal.

16. The combination of a conductive housing having an associated cover and an electrically conductive seal in accordance with claim 10, wherein the electrically conductive seal is manufactured wherein the movement speed of the co-extrusion tool or of the housing section may be changed in order to influence the thickness of the seal.

17. The combination of a conductive housing having an associated cover and an electrically conductive seal in accordance with claim 10, wherein the electrically conductive seal is manufactured wherein the movement speed of the co-extrusion tool or of the housing section may be changed in order to influence tie thickness of the seal.

18. The combination of a conductive housing having an associated cover and an electrically conductive seal in accordance with claim 9, wherein the electrically conductive seal is manufactured wherein the respective extrusion pressure for the formation of the sealant strand, of the conductive strand and the absorber strand is variably adjustable in the respectively-desired variable thickness.

19. The combination of a conductive housing having an associated cover and an electrically conductive seal in accordance with claim 10, wherein the electrically conductive seal is manufactured wherein the respective extrusion pressure for the formation of the sealant strand, of the conductive strand and the absorber strand is variably adjustable in the respectively-desired variable thickness.

20. The combination of a conductive housing having an associated cover and an electrically conductive seal in accordance with claim 11, wherein the electrically conductive seal is manufactured wherein the respective extrusion pressure for the formation of the sealant strand, of the conductive strand and the absorber strand is variably adjustable in the respectively-desired variable thickness.

21. The combination of a conductive housing having an associated cover and an electrically conductive seal in accordance with claim 12 wherein the electrically conductive seal is manufactured wherein the respective extrusion pressure for the formation of the sealant strand, of the conductive strand and the absorber strand is variably adjustable in the respectively-desired variable thickness.

22. The combination of a conductive housing having an associated cover and an electrically conductive seal in accordance with claim 15 wherein the electrically conductive seal is manufactured wherein the respective extrusion pressure for the formation of the sealant strand, of the conductive strand and the absorber strand is variably adjustable in the respectively-desired variable thickness.

23. The combination of a conductive housing having an associated cover and an electrically conductive seal in accordance with claim 16, wherein the electrically conductive seal is manufactured wherein the respective extrusion pressure for the formation of the sealant strand, of the conductive strand and the absorber strand is variably adjustable in the respectively-desired variable thickness.

24. The combination of a conductive housing having an associated cover and an electrically conductive seal in accordance with claim 17 wherein the electrically conductive seal is manufactured wherein the respective extrusion pressure for the formation of the sealant strand, of the conductive strand and the absorber strand is variably adjustable in the respectively-desired variable thickness.

25. An electrically conductive seal which is applied onto a sealing surface while freshly-extruded and in a condition which is still plastic for sealing a gap of a conductive housing which accommodates electromagnetic modules for electromagnetic shielding and for prevention of the material transfer past the sealing gap, wherein the electrically conductive sealant is made by means of co-extrusion constructed from at least one internally-positioned elastic sealant strand which is free of conductive components and at least one ring-shaped external electrically conductive strand, which encompasses the at least one internally-positioned elastic sealant strand, has low inherent elasticity and wall thickness, and is made of a non-conductive sealant mixed with electrically conductive components,
    wherein there is an internally-positioned absorber strand made of an elastic sealant which is mixed with magnetic components.

26. An electrically conductive seal which is applied onto a sealing surface while freshly-extruded and in a condition which is still plastic for sealing a gap of a conductive housing which accommodates electromagnetic modules for electromagnetic shielding and for prevention of material transfer past the sealing gap,
    wherein the electrically conductive seal is made by means of co-extrusion constructed from at least one internally-positioned elastic sealant strand which is free of conductive components and at least one ring-shaped external electrically conductive strand, which encompasses the at least one internally-positioned elastic sealant strand, has low inherent elasticity and wall thickness, and is made of a non-conductive sealant mixed with electrically conductive components,
    wherein an absorber strand is designed in a ring-shape and lies between the sealant strand and the conductive strand.

27. An electrically conductive seal which is applied onto a sealing surface while freshly-extruded and in a condition which is still plastic for sealing a gap of a conductive housing which accommodates electromagnetic modules for electromagnetic shielding and for prevention of material transfer past the sealing gap,
    wherein the electrically conductive seal is made by means of co-extrusion constructed from at least one internally-positioned elastic sealant strand which is free of conductive components and at least one ring-shaped external electrically conductive strand, which encompasses the at least one internally-positioned elastic sealant strand, has low inherent elasticity and wall thickness, and is made of a non-conductive sealant mixed with electrically conductive components,
    wherein an absorber strand is constructed as a centrally-arranged full strand which is encompassed by the conductive strand or the sealant strand and an additional conductive strand.

28. An electrically conductive seal which is applied onto a sealing surface while freshly-extruded and in a condition which is still plastic and not yet hardened for sealing a gap of a conductive housing which accommodates electromagnetic modules for electromagnetic shielding and for prevention of material transfer past the sealing gap, wherein the electrically conductive seal is made by means of co-extrusion constructed from at least one internally-positioned elastic sealant strand which is free of conductive components and is still plastic and not yet hardened, and at least one ring-shaped external electrically conductive strand, which is still plastic and not yet hardened, and which encompasses the at least one internally-positioned elastic sealant strand, has low inherent elasticity and wall thickness and is made of a non-conductive sealant mixed with electrically conductive components,
    said electrically conductive seal further comprising at least one internally-positioned absorber strand comprising an elastic sealant which is mixed with magnetic components.

29. An electrically conductive seal in accordance with claim 28, characterized in that the absorber strand is constructed as a centrally-arranged full strand which is encompassed by a conductive strand or a sealant strand and a conductive strand.

30. An electrically conductive seal in accordance with claim 28, wherein the magnetic components of the absorber strand comprise at least one of nickel and iron.

31. An electrically conductive seal in accordance with claim 28, wherein the thickness of the sealant and conductive strand as well as that of the absorber strand may be changed.

32. An electrically conductive seal in accordance with claim 29, wherein the thickness of the sealant and conductive strand as well as that of the absorber strand may be changed.

33. An electrically conductive seal in accordance with claim 30, wherein the thickness of the sealant and conductive strand as well as that of the absorber strand may be changed.

* * * * *